United States Patent
Rango et al.

(10) Patent No.: US 12,206,098 B2
(45) Date of Patent: Jan. 21, 2025

(54) BATTERY FUEL GAUGES, BATTERY MANAGEMENT SYSTEMS, AND METHODS OF MANAGING BATTERY LIFE CYCLE

(71) Applicant: Enevate Corporation, Irvine, CA (US)

(72) Inventors: Robert A. Rango, Newport Coast, CA (US); Benjamin Yong Park, Mission Viejo, CA (US)

(73) Assignee: ENEVATE CORPORATION, Irvine, CA (US)

( * ) Notice: Subject to any disclaimer, the term of this patent is extended or adjusted under 35 U.S.C. 154(b) by 0 days.

(21) Appl. No.: 15/995,000

(22) Filed: May 31, 2018

(65) Prior Publication Data

US 2019/0178944 A1    Jun. 13, 2019

Related U.S. Application Data

(60) Provisional application No. 62/596,070, filed on Dec. 7, 2017.

(51) Int. Cl.
*H01M 4/38* (2006.01)
*G01R 31/36* (2020.01)
(Continued)

(52) U.S. Cl.
CPC ........ *H01M 4/386* (2013.01); *G01R 31/3646* (2019.01); *G01R 31/387* (2019.01); *G01R 31/392* (2019.01); *H01M 10/0525* (2013.01); *H01M 10/425* (2013.01); *H01M 10/44* (2013.01); *H01M 10/48* (2013.01); *H01M 10/488* (2013.01); *H01M 10/617* (2015.04); *H01M 10/633* (2015.04); *H02J 7/0013* (2013.01); *H02J 7/0029* (2013.01); *G01R 31/382* (2019.01); *H01M 2004/027* (2013.01); *H01M 2010/4271* (2013.01);
(Continued)

(58) Field of Classification Search
CPC .................................................. H01M 10/445
See application file for complete search history.

(56) References Cited

U.S. PATENT DOCUMENTS

5,438,249 A * 8/1995 Chang ................. H01M 10/488
320/137
7,870,776 B1 * 1/2011 Whitney .............. G01G 23/012
73/1.13
(Continued)

OTHER PUBLICATIONS

Ma et al., "Si-Based Anode Materials for Li-Ion Batteries: A Mini Review", Nano-Micro Letters, 2014, vol. 6, No. 4, pp. 347-358.
(Continued)

*Primary Examiner* — Drew A Dunn
*Assistant Examiner* — Tynese V McDaniel
(74) *Attorney, Agent, or Firm* — McAndrews, Held & Malloy, Ltd.

(57) ABSTRACT

In various embodiments, a battery fuel gauge includes a processor. The processor can be configured to obtain information relating to expansion of a battery and to determine a state of charge and/or a state of health of the battery based at least in part on the expansion of the battery. In certain embodiments, a battery management system can be configured to control charging/discharging and/or cooling/heating of one or more cells in the battery based at least in part on the expansion of the battery.

24 Claims, 4 Drawing Sheets

(51) Int. Cl.

| | |
|---|---|
| *G01R 31/382* | (2019.01) |
| *G01R 31/387* | (2019.01) |
| *G01R 31/392* | (2019.01) |
| *H01M 4/02* | (2006.01) |
| *H01M 10/0525* | (2010.01) |
| *H01M 10/42* | (2006.01) |
| *H01M 10/44* | (2006.01) |
| *H01M 10/48* | (2006.01) |
| *H01M 10/617* | (2014.01) |
| *H01M 10/633* | (2014.01) |
| *H02J 7/00* | (2006.01) |

(52) U.S. Cl.
CPC ....... *H02J 7/00302* (2020.01); *H02J 7/00306* (2020.01); *H02J 7/0048* (2020.01); *H02J 7/005* (2020.01)

(56) References Cited

U.S. PATENT DOCUMENTS

| | | | |
|---|---|---|---|
| 8,603,683 B2 | 12/2013 | Park et al. | |
| 9,178,208 B2 | 11/2015 | Park et al. | |
| 9,397,338 B2 | 7/2016 | Park et al. | |
| 9,553,303 B2 | 1/2017 | Park et al. | |
| 9,583,757 B2 | 2/2017 | Park et al. | |
| 9,620,809 B2 | 4/2017 | Turon Teixidor et al. | |
| 9,647,259 B2 | 5/2017 | Park et al. | |
| 9,806,328 B2 | 10/2017 | Park et al. | |
| 9,941,509 B2 | 4/2018 | Park et al. | |
| 9,997,765 B2 | 6/2018 | Park | |
| 10,103,378 B2 | 10/2018 | Park et al. | |
| 10,388,943 B2 | 8/2019 | Bonhomme et al. | |
| 10,431,808 B2 | 10/2019 | Park et al. | |
| 10,461,366 B1 | 10/2019 | Anderson et al. | |
| 2009/0286155 A1* | 11/2009 | Takehara | C01B 25/455 |
| | | | 429/199 |
| 2010/0255376 A1 | 10/2010 | Park et al. | |
| 2010/0285338 A1* | 11/2010 | Christensen | H01M 10/0525 |
| | | | 429/50 |
| 2011/0020701 A1 | 1/2011 | Park et al. | |
| 2014/0007695 A1* | 1/2014 | Darbe | G01N 3/12 |
| | | | 73/803 |
| 2014/0107949 A1* | 4/2014 | Arnold | G01R 31/392 |
| | | | 702/42 |
| 2014/0151079 A1* | 6/2014 | Furui | B25F 3/00 |
| | | | 173/46 |
| 2014/0170498 A1 | 6/2014 | Park | |
| 2014/0333312 A1* | 11/2014 | Schlag | H01M 10/48 |
| | | | 324/426 |
| 2015/0160302 A1* | 6/2015 | Xu | H01M 10/42 |
| | | | 324/427 |
| 2015/0362557 A1* | 12/2015 | Takashima | B60L 58/21 |
| | | | 324/426 |
| 2016/0064780 A1* | 3/2016 | Jarvis | H01M 10/4257 |
| | | | 429/50 |
| 2016/0164061 A1* | 6/2016 | Han | H01M 50/20 |
| | | | 429/120 |
| 2016/0197382 A1 | 7/2016 | Sood et al. | |
| 2017/0040598 A1 | 2/2017 | Wang et al. | |
| 2017/0047621 A1* | 2/2017 | Fukuda | G01L 9/14 |
| 2017/0133664 A1 | 5/2017 | Park | |
| 2017/0133665 A1 | 5/2017 | Park | |
| 2017/0155126 A1 | 6/2017 | Park | |
| 2017/0170510 A1 | 6/2017 | Turon Teixidor et al. | |
| 2017/0279093 A1 | 9/2017 | Park | |
| 2017/0324122 A1* | 11/2017 | Poirier | H01M 50/44 |
| 2018/0062154 A1 | 3/2018 | Park et al. | |
| 2018/0198114 A1 | 7/2018 | Bonhomme et al. | |
| 2018/0219211 A1 | 8/2018 | Park et al. | |
| 2018/0226642 A1 | 8/2018 | Wang et al. | |
| 2018/0287129 A1 | 10/2018 | Park | |
| 2019/0181426 A1 | 6/2019 | Park et al. | |
| 2019/0181431 A1 | 6/2019 | Canton | |
| 2019/0181434 A1 | 6/2019 | Lee et al. | |
| 2019/0181440 A1 | 6/2019 | Park et al. | |
| 2019/0181441 A1 | 6/2019 | Ji et al. | |
| 2019/0181491 A1 | 6/2019 | Park et al. | |
| 2019/0181492 A1 | 6/2019 | Liu et al. | |
| 2019/0181500 A1 | 6/2019 | Ji et al. | |
| 2019/0181501 A1 | 6/2019 | Ji et al. | |
| 2019/0181502 A1 | 6/2019 | Ji et al. | |
| 2019/0187004 A1* | 6/2019 | Durrer | G01K 1/14 |
| 2019/0190069 A1 | 6/2019 | Ji et al. | |
| 2019/0190070 A1 | 6/2019 | Ji et al. | |
| 2019/0355966 A1 | 11/2019 | Kamath et al. | |
| 2019/0372088 A1 | 12/2019 | Bonhomme et al. | |
| 2021/0257678 A1* | 8/2021 | Schmidt | H01M 10/486 |

OTHER PUBLICATIONS

Written Opinion for International Application No. PCT/US2018/064296, dated Nov. 5, 2019 in 4 pages.

International Search Report and Written Opinion for International Application No. PCT/US2018/064296, dated Mar. 1, 2019 in 10 pages.

* cited by examiner

BATTERY FUEL GAUGES, BATTERY MANAGEMENT SYSTEMS, AND METHODS OF MANAGING BATTERY LIFE CYCLE

CROSS-REFERENCE TO RELATED APPLICATIONS

This application claims the benefit of U.S. Provisional Application No. 62/596,070, filed Dec. 7, 2017. The entirety of the above referenced application is hereby incorporated by reference.

BACKGROUND

Field

The present disclosure relates to electrochemical cells and batteries. In particular, the present disclosure relates to battery fuel gauges, battery management systems, and methods of managing battery life cycle.

Description of the Related Art

Accurate battery fuel gauging and proper life cycle management of battery cells are desired to extend cycle life and increase and/or maximize performance, for example, in consumer electronics and electric vehicles (EVs). Battery management can include utilizing specific characteristics of a battery as it ages to change charge rates, discharge rates, temperature, cooling, etc. For example, a battery's state of charge and/or state of health can be used. The state of health (SOH) of a battery compares the condition of the battery to its ideal state. The SOH of a battery can be at 100% after it is manufactured and tested (e.g., 100% of its specification). The SOH can reduce over use and time. The state of charge (SOC) of a battery describes the current charged state of the battery. The SOC of a battery can be 100% after being fully charged and reduce over use and time.

SUMMARY

Example battery fuel gauges are provided. The battery fuel gauge can be configured to determine a state of charge and/or a state of health of a battery comprising one or more cells having a silicon-containing electrode. The battery fuel gauge can include a processor. The processor can be configured to receive information relating to expansion of the battery and determine the state of charge and/or state of health of the battery based at least in part on the expansion of the battery.

In some examples, the battery fuel gauge can comprise a display configured to provide the determined state of charge and/or state of health of the battery.

In some examples, the information relating to expansion of the battery can comprise a thickness change, a volume change, and/or a pressure change of at least one cell of the battery. In some instances, the processor can be configured to reset a thickness, volume, and/or pressure baseline at a known state of charge.

In some battery fuel gauges, the information can be obtained by a strain sensor, a pressure sensor, a force gauge, an optical distance gauge, a mechanical distance gauge, or a combination thereof. In some battery fuel gauges, the information can comprise a change in fluid volume or change in pressure on fluid within the battery.

In some examples, the battery can be a lithium ion battery.

In some instances, the battery can comprise one or more silicon-dominant anodes.

Example battery management systems are provided. The battery management system can comprise any of the battery fuel gauges described herein. The battery management system can be configured to control charging/discharging and/or cooling/heating of one or more cells in the battery based at least in part on the expansion of the battery. In some instances, the battery management system can be configured to trigger one or more safety mechanisms when the expansion is above a threshold.

Example methods of managing a life cycle of a battery are provided. The battery can comprise one or more cells having a silicon-containing electrode. The method can include receiving information relating to expansion of the battery, and controlling charging/discharging and/or cooling/heating of one or more cells of the battery based at least in part on the expansion.

In some methods, the information relating to expansion of the battery can include a thickness change, a volume change, and/or a pressure change of at least one cell of the battery.

In some instances, the method can include determining a state of charge and/or state of health of the battery based at least in part on the expansion of the battery. Controlling charging/discharging and/or cooling/heating can be based at least in part on the state of charge and/or state of health.

Some methods can further comprise resetting a thickness, volume, and/or pressure baseline at a known state of charge.

Some methods can further comprise determining gassing of one or more cells of the battery and/or damage to the battery based at least in part on the expansion.

Some methods can further comprise triggering one or more safety mechanisms when the expansion is above a threshold.

In some methods, the information can be obtained by a strain sensor, a pressure sensor, a force gauge, an optical distance gauge, a mechanical distance gauge, or a combination thereof.

In some methods, the information can comprise a change in fluid volume or change in pressure on fluid within the battery.

In some methods, the battery can be a lithium ion battery.

In some methods, the battery can comprise one or more silicon-dominant anodes.

DETAILED DESCRIPTION

Figure 1:
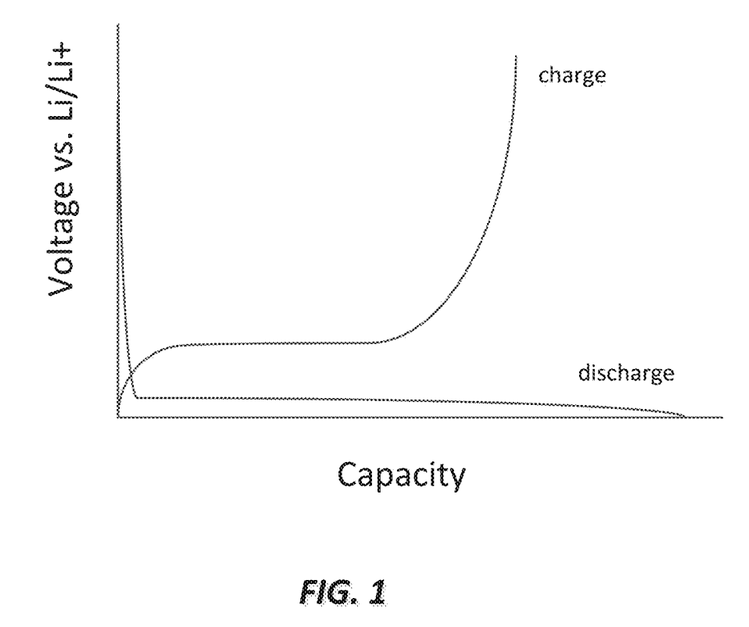
FIG. 1 schematically illustrates an example charge/discharge curve of a silicon-containing electrode.

Lithium ion battery life can be critical in various instances and managing the state of health (SOH) of the electrochemical cells can be desirable to limit and control cell degradation. When the state of charge (SOC) is increased beyond a certain limit (e.g., depending on temperature), lithium ion batteries can have accelerated fade. Typically, the SOC is inferred mainly from electrical measurements, for example, from the voltage of the cell. However, the true SOC can be difficult to estimate as there is typically fluctuating current draw on the cells which can cause voltage to change due to overpotentials within the system. Many lithium ion chemistries also have plateaus in the charge/discharge curve (e.g., voltage v. SOC). In the plateau region, it can be difficult to gauge SOC as the same or similar voltage represents a wide range of SOC. In addition, certain chemistries (e.g., silicon-containing cells) can have issues in fuel gauging using voltage due to significant hysteresis in the charge/discharge curve. For example, as shown in FIG. 1, the voltage when charging is different from the voltage when discharging for silicon-containing electrodes. Furthermore, temperature (e.g., cell temperature and/or environmental temperature) can affect voltage measurements.

In general, lithium ion batteries experience thickness changes during charging and over the course of their life. Also, cells of certain chemistries (e.g., silicon-containing cells) typically increase in thickness during charging and over the course of their life. Certain embodiments of battery fuel gauges described herein can measure the amount of swelling/expansion to determine the SOC. For example, the amount of expansion can be measured in terms of the thickness change, the volume change, and/or the pressure that is created in the housing where the swelling is contained (such as in an Electric Vehicle battery pack). Compared to electrical measurements, the amount of expansion can be more directly correlated to SOC as it is less likely to fluctuate due to current draw swings. In addition, expansion typically exhibits less or no hysteresis. A more accurate SOC can provide a more accurate estimate of remaining capacity/energy in the cell so that the user or device can plan ahead (e.g., minutes of usage left in a cell phone or miles left in a vehicle).

Cell swelling (e.g., increase in thickness) can be a nuisance item for battery pack designers. Pack designers usually take swelling into account to modify the physical design of the pack. However, cell swelling has not been used to help manage cell SOC and SOH (especially in silicon-containing cells, e.g., in silicon-dominant cells where silicon is the majority of the active material used in one of the electrodes—typically the anode). In certain embodiments described herein, using expansion information can provide a battery management system (BMS) with valuable insights into the SOC and SOH. Using expansion information (e.g., adding it to the BMS algorithm calculations that control cell charging, discharging, cooling, and heating over the life of the cell) can allow the BMS algorithm to more accurately control charging and discharging of the cells to reduce the risk that the cells may be overcharged or overdischarged, resulting in performance and safety benefits. Accordingly, various embodiments described herein can improve battery fuel gauging and battery life management.

Figure 2A:
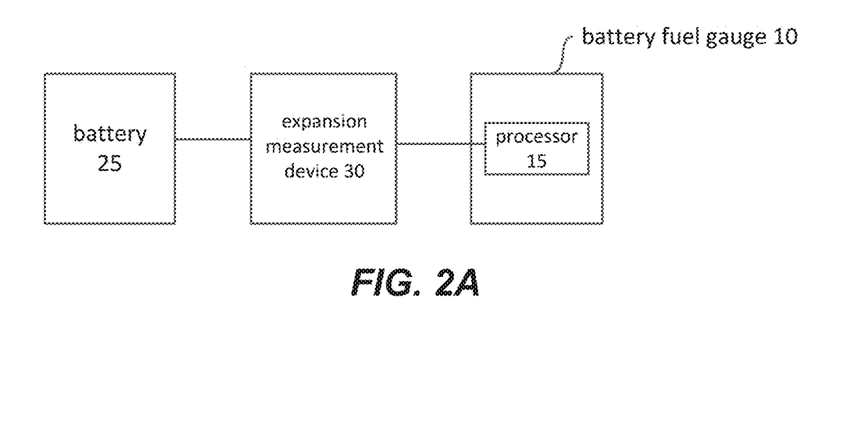
FIG. 2A schematically illustrates an example battery fuel gauge configured to determine a state of charge and/or state of health of a battery.

FIG. 2A schematically illustrates an example battery fuel gauge 10 configured to determine a SOC and/or SOH of a battery 25. The fuel gauge 10 can include a processor 15 configured to obtain information relating to the expansion of the battery 25. For example, the processor 15 of the fuel gauge 10 can receive information from an expansion measurement device 30 connected to the battery 25. The processor 15 of the fuel gauge 10 can determine the SOC and/or the SOH of the battery 25 based at least in part on the received information relating to expansion of the battery 25.

Figure 2B:
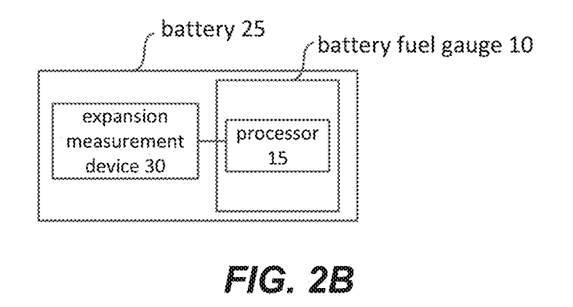
FIG. 2B schematically illustrates an example battery fuel gauge incorporated into a battery in accordance with certain embodiments described herein.

In FIG. 2A, the example battery fuel gauge 10 and expansion measurement device 30 are illustrated as separate from the battery 25. As shown in FIG. 2B, the example battery fuel gauge 10 and/or expansion measurement device 30 can be incorporated into the battery 25. The battery fuel gauge 10 can be used in a device such as a cell phone, a tablet, a vehicle, etc. In various implementations, the battery 25 can be rechargeable and connectable to a charger. The battery 25 can be a lithium ion battery or any other battery (e.g., any battery that expands). The battery 25 can include electrodes comprising material that expands, for example, in a significant manner (e.g., silicon).

As an example, the battery 25 can include a silicon-containing electrode (e.g., a silicon-dominant electrode in some instances). The active material can include at least about 20% by weight of silicon (e.g., at least about 30%, at least about 50%, etc.). In certain embodiments, the active material can include at least about 20% to about 100% by weight of silicon. For example, the weight percentage of silicon can be any value within this range (e.g., about 20%, about 25%, about 30%, about 35%, about 40%, about 45%, about 50%, about 55%, about 60%, about 65%, about 70%, about 75%, about 80%, about 85%, about 90%, about 95%, about 96%, about 97%, about 98%, about 99%, about 100%, etc.), or any range within this range such as any range formed by the example values (e.g., about 30% to about 100%, about 40% to about 100%, about 50% to about 100%, about 60% to about 100%, about 70% to about 100%, about 80% to about 100%, about 90% to about 100%, about 20% to about 99%, about 30% to about 99%, about 40% to about 99%, about 50% to about 99%, about 60% to about 99%, about 70% to about 99%, about 80% to about 99%, about 90% to about 99%, about 20% to about 95%, about 30% to about 95%, about 40% to about 95%, about 50% to about 95%, about 60% to about 95%, about 70% to about 95%, about 80% to about 95%, about 20% to about 90%, about 30% to about 90%, about 40% to about 90%, about 50% to about 90%, about 60% to about 90%, about 70% to about 90%, about 80% to about 90%, etc.). The electrode can also include additives such as conductive material (e.g., one or more metals or alloys) and/or graphite active material.

U.S. patent application Ser. No. 13/008,800, filed Jan. 18, 2011, and published on Jul. 21, 2011 as U.S. Patent Application Publication No. 2011/0177393, entitled "Composite Materials for Electrochemical Storage;" U.S. patent application Ser. No. 13/601,976, filed Aug. 31, 2012, and published on Jun. 19, 2014 as U.S. Patent Application Publication No. 2014/0170498, entitled "Silicon Particles for Battery Electrodes;" and U.S. patent application Ser. No. 13/799,405, filed Mar. 13, 2013, and published on Jun. 19, 2014 as U.S. Patent Application Publication No. 2014/0166939, entitled "Silicon Particles for Battery Electrodes," each of which is incorporated by reference herein, describe certain embodiments of carbon-silicon composite materials using carbonized polymer and silicon material which can be used as the silicon-containing electrode. Example embodiments of the electrode are described herein. The silicon-containing electrode can be used as an anode, a cathode, or both an anode and cathode. For example, the composite material can be used as an anode in electrochemical cells, e.g., most conventional lithium-ion batteries; they may also be used as the cathode in some electrochemical couples, e.g., with additional additives.

In some embodiments, the battery 25 can include a battery pack comprising one or more modules. The modules can contain one or more electrochemical cells (e.g., one or more lithium ion cells). The information provided by the expansion measurement device 30 can relate to a thickness change, a volume change, and/or a pressure change of the battery 25 (e.g., of one or more cells, of one or more modules, or of the whole battery).

A lithium ion cell can expand for a variety of reasons. For example, expansion can occur as the cell is charged or discharged. Expansion can be due to the SOC. As another example, expansion can occur as the cell is aged. Typically, the cell can exhibit expansion as the cell is cycled. The cell can expand due to calendar life storage as well. As yet another example, expansion can occur due to gassing or other abnormal damage to the cell.

Lithium ion cells containing silicon as an active material can expand more due to SOC change and cycle life. Lithium ion cells containing silicon-dominant electrodes (e.g., greater than 50% silicon) can expand more compared to graphite and graphite-dominant electrode containing cells or cells containing lithium titanate in the electrode. For example, cells containing graphite-dominant anodes typically exhibit about 0 to about 8% expansion from 0% SOC to 100% SOC and about 0 to about 10% expansion during the life of the cell (e.g., 500-2000 cycles). Cells containing silicon-dominate anodes exhibit about 1 to about 25% expansion from 0% SOC to 100% SOC and about 2 to about 50% expansion during the life of the cell. In some embodiments, factors affecting expansion include, but are not limited to, cell design, pressure or constraint on the cell when testing, temperature, current rates, state of charge/discharge, voltage ranges, atmospheric pressure, past history of cell, etc. Various embodiments can utilize a negative attribute (e.g., excessive swelling) in a positive way (e.g., improved battery fuel gauging and/or life cycle management). Compared to a voltage reading, expansion can be more directly correlated to SOC. Further, expansion typically exhibits less hysteresis. For cells containing silicon-based electrodes (especially silicon-dominant electrodes), the expansion of the cell can be dominated by the silicon and the fuel-gauging can be more accurate than for a system where there is not one component dominating the expansion in a significant manner.

In various embodiments, expansion can be measured by an expansion measuring device 30. The expansion measuring device 30 can be placed within a cell (e.g., within a can cell), within a module outside of a stack of cells, within a battery outside one or more modules, or outside of the battery. The expansion measurement device 30 can be connected to the battery in any way known in the art or yet to be developed. For example, the expansion measurement device 30 can be physically coupled with the battery 25 (e.g., solder, adhesive, etc.). The expansion measurement device 30 can be connected to and/or in communication with the battery fuel gauge 10 in any way known in the art or yet to be developed. In some embodiments, the expansion measurement device 30 can be in communication and/or coupled with the battery fuel gauge, for example, via electronics or wireless communication.

The expansion measuring device 30 can measure expansion in terms of a thickness change of the battery (e.g., of one or more cells, of one or more modules, or of the whole battery). The expansion measuring device 30 can include any device to measure a thickness change. For example, the expansion measuring device 30 can include a strain sensor, an optical distance gauge, and/or a mechanical distance gauge. Other examples are possible. In some embodiments, the expansion measuring device 30 can measure expansion in terms of a volume change instead of only thickness. For example, the expansion measuring device 30 can be configured to measure a change in three dimensions to determine a volume change. In some embodiments, the expansion measuring device 30 can be configured to measure a change in fluid volume within one or more cells, within one or more modules, and/or within a battery, e.g., using Archimedes' method. As the volume increases within one or more cells, within one or more modules, or within a battery, the pressure can also increase. In some instances, the expansion measuring device 30 can measure expansion in terms of a pressure change. For example, the expansion measuring device 30 can be configured to measure the pressure using Archimedes' method (e.g., pressure on the fluid). In some embodiments, the expansion measuring device 30 can include a pressure sensor to monitor a change in pressure inside one or more cells, inside one or more modules, or inside a battery. In some embodiments, the expansion measuring device 30 can include a force gauge placed on top of one or more cells (e.g., within a module) and placed between a fixed gap. As the one or more cells expand, the force gauge can measure the force and/or pressure. In some embodiments, one or more modules and/or the battery can be immersed in fluid to measure the change in fluid volume and/or change in pressure exerted on the fluid. Other examples are possible.

In some embodiments, the battery fuel gauge 10 can determine the SOC and/or SOH of the battery 25 based on the expansion of the battery 25. In some instances, the battery fuel gauge 10 can determine the SOC and/or SOH of the battery 25 based on the expansion of the battery 25 in addition to other parameters (e.g., voltage, history, etc.) to provide a more accurate determination than if the expansion information were not included.

In certain embodiments, the battery fuel gauge 10 (e.g., via the processor 15) can be configured to reset an expansion baseline at a known SOC. For example, when the battery 25 is at the maximum voltage (100% SOC) or at the minimum voltage (0% SOC), the battery fuel gauge 10 can recalibrate the baseline (e.g., thickness, volume, pressure, etc.) at that state as the new reference baseline. By resetting the expansion baseline value (e.g., thickness baseline, volume baseline, pressure baseline, etc.), the effects of factors other than SOC, such as, ageing, on the SOC measurements per cycle can be reduced. For example, the thickness of the cell can increase over time due to cycling, which can affect the SOC measurements per cycle. In some instances, without resetting, the increase in thickness due to cycling may be perceived as if the cell is partially charged.

Various embodiments of the battery fuel gauge 10 can include a display to provide the determined SOC and/or SOH of the battery 25. In some instances, the display can provide the determined SOC and/or SOH via an analog or digital display. In some instances, the SOC and/or SOH might not be displayed, but may be provided as input to another device or system such as to a battery management system.

Figure 3A:
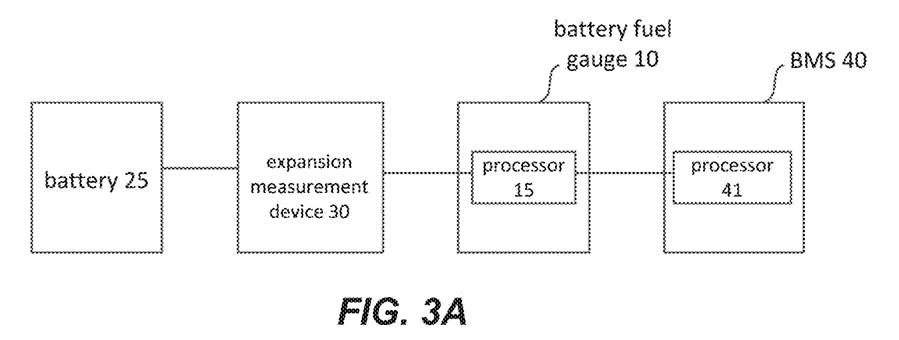
FIGS. 3A, 3B, 3C, and 3D schematically illustrate example battery management systems configured to manage a battery life cycle.
Figure 3B:
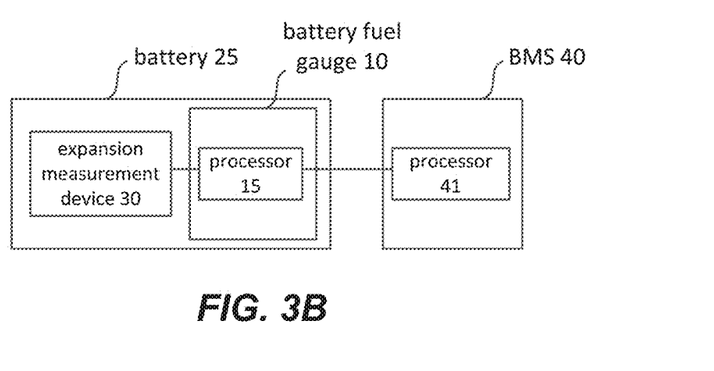

Various embodiments described herein can include a battery management system (BMS). For example, FIGS. 3A and 3B schematically illustrate a BMS 40 in communication and/or coupled with a battery fuel gauge 10 shown in FIGS. 2A and 2B respectively. In some embodiments, the battery fuel gauge 10 and the BMS 40 can be in communication and/or coupled with each other, for example, via electronics or wireless communication. In some embodiments, a processor 15 of the battery fuel gauge 10 can be in communication with the processor 41 of the BMS 40.

Figure 3C:
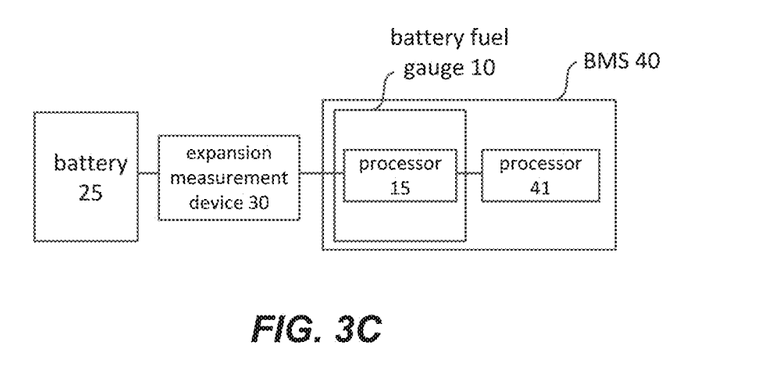
Figure 3D:
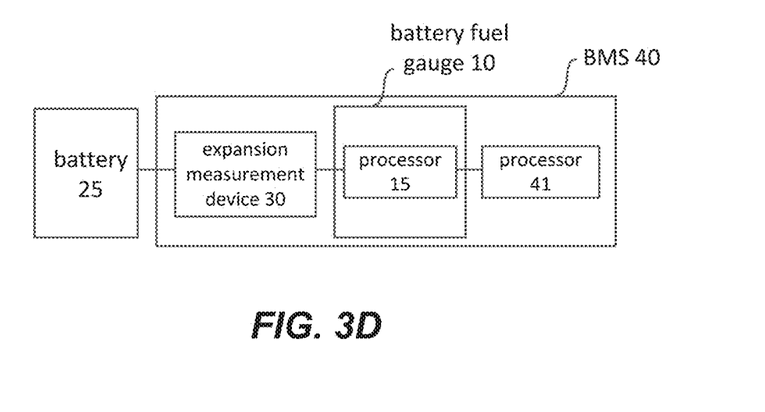

FIGS. 3A and 3B illustrate a BMS 40 separate from the battery fuel gauge 10. As shown in FIG. 3C, the battery fuel gauge 10 can be incorporated into a BMS 40. As shown in FIG. 3D, the battery fuel gauge 10 and expansion measurement device 30 can be incorporated into a BMS 40. In some embodiments, the BMS 40 may be incorporated into a battery 25. In FIGS. 3A-3D, the processor 41 of the BMS is illustrated as being in communication and/or coupled with the processor 15 of the battery fuel gauge 10. In some embodiments, the processor 15 of the battery fuel gauge 10 can be incorporated into the processor 41 of the BMS 40, or vice versa. For example, although the processors 15, 41 are shown as separate, in some embodiments, the processors 15, 41 can be combined.

In certain embodiments, the BMS 40 may be connected to and/or in communication with the charger of the battery 25. In some instances, the BMS 40 (e.g., via the processor 41) can be configured to control charging/discharging of one or more cells in the battery 25 based at least in part on the information relating to expansion. In some embodiments, the BMS 40 can be connected to and/or in communication with a temperature controller of the battery 25. In some instances, the BMS 40 (e.g., via the processor 41) can be configured to control cooling/heating of one or more cells in the battery 25 based at least in part on the information relating to expansion. In some implementations, the information relating to the expansion of the battery can be provided into the BMS algorithm in addition to other parameters such as voltage, history, etc. to more accurately manage the life cycle of the battery 25.

In various embodiments, the BMS 40 (e.g., via the processor 41) can be configured to trigger one or more safety mechanisms when the expansion (e.g., thickness change, volume change, pressure change, etc.) is above a certain threshold (e.g., a certain numerical value, a certain numerical change, a certain percentage change, a certain rate of change, etc.). An example threshold can include a change that is higher than a 100% change (such as in thickness) (e.g., at least about 1% higher, at least about 2% higher, at least about 3% higher, at least about 4% higher, at least about 5% higher, at least about 10% higher, at least about 15% higher, at least about 20% higher, etc.), or a range formed by such example values (e.g., about 1% to about 20% higher, about 1% to about 15% higher, about 1% to about 10% higher, about 1% to about 5% higher, etc.) In some instances, expansion outside a normal range can indicate gassing of one or more cells, damage to the battery pack, and/or any other abnormal situation. For example, a sudden increase in thickness, volume, and/or pressure may suggest a dangerous or otherwise undesirable situation. In some such cases, the BMS 40 can be configured to cool one or more cells, disconnect one or more cells, shut the battery down fully, etc.

Figure 4:
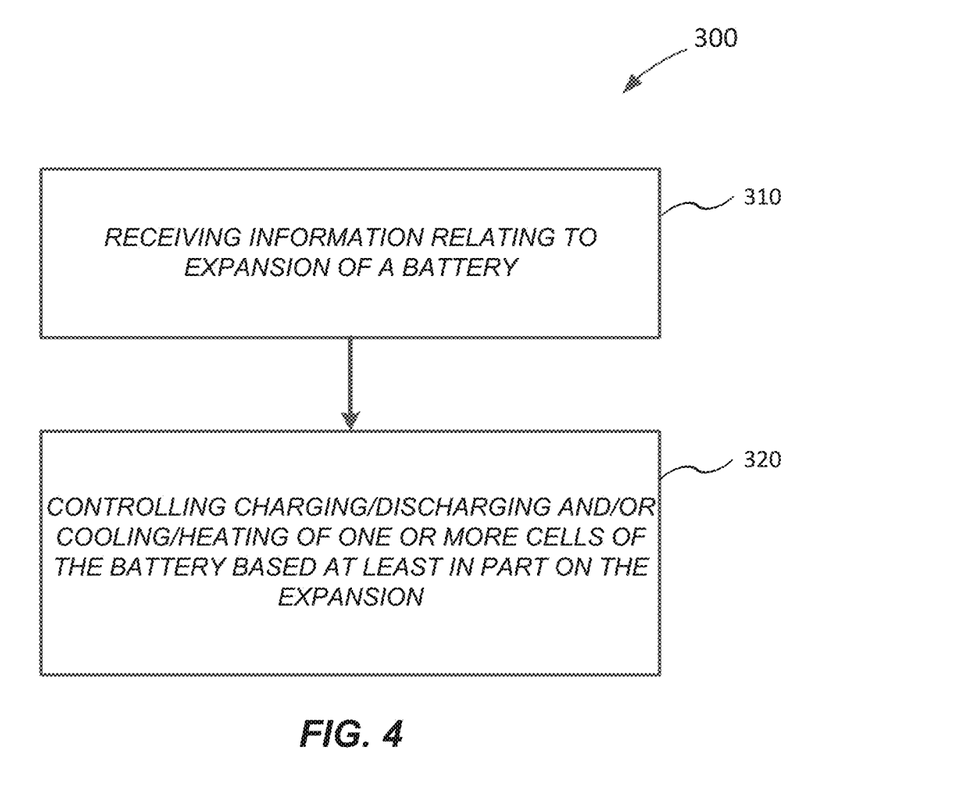
FIG. 4 shows an example method of managing a life cycle of a battery in accordance with certain embodiments described herein.

FIG. 4 illustrates an example method of managing a life cycle of a battery. The method 300 can include receiving information relating to expansion of a battery, as shown in block 310, and controlling charging/discharging and/or cooling/heating of one or more cells of the battery based at least in part on the expansion, as shown in block 320. The method 300 can include determining a SOC and/or SOH of the battery based on the expansion of the battery. Controlling charging/discharging and/or cooling/heating can be based at least in part on the SOC and/or SOH.

In some embodiments, the battery can include a lithium ion battery or any other battery (e.g., any battery that swells). In some instances, the battery can comprise one or more silicon-containing electrodes (e.g., one or more silicon-dominant electrodes) or one or more electrodes comprising any material that may swell. As described herein, the expansion can be a thickness change, a volume change, and/or a pressure change of one or more cells, one or more modules, or of the whole battery. The method 300 can receive information relating to expansion of the battery from a strain sensor, a pressure sensor, a force gauge, an optical distance gauge, a mechanical distance gauge, or a combination thereof. The information in some instances, can include a change in fluid volume or a change in pressure on the fluid within the battery.

The method 300 can further include resetting an expansion baseline (e.g., a thickness, volume, and/or pressure baseline) at a known SOC. In some instances, the method 300 can include determining gassing of one or more cells of the battery and/or damage to the battery based at least in part on the expansion. The method 300 can further include triggering one or more safety mechanisms when the expansion is above a threshold.

The method disclosed herein to manage the life cycle of a battery can be executed by a processor or computing device via instructions provided on a non-transitory tangible computer storage medium. The computer storage medium can include any medium accessible by a processor or computing device, including but not limited to random access memory (RAM), read only memory (ROM), flash memory, optical discs, hard-disk drive, etc. In some embodiments, the non-transitory tangible computer storage medium can have stored thereon instructions for controlling a battery management system. The instructions when executed by a computing system, can cause the battery management system to perform operations. The operations can include any methods described herein, e.g., method 300.

Example Electrodes and Methods of Forming the Same

In various embodiments, the electrodes (e.g., anodes and cathodes) may include carbonized polymer and silicon material. For example, a mixture that includes a carbon precursor including silicon material can be formed into a composite material. This mixture can include both carbon and silicon and thus can be referred to as a carbon-silicon composite material, a silicon-carbon composite material, a carbon composite material, or a silicon composite material.

Typical carbon anode electrodes include a current collector such as a copper sheet. Carbon is deposited onto the collector along with an inactive binder material. Carbon is often used because it has excellent electrochemical properties and is also electrically conductive. Anode electrodes used in the rechargeable lithium-ion cells typically have a specific capacity of approximately 200 milliamp hours per gram (including the metal foil current collector, conductive additives, and binder material). Graphite, the active material used in most lithium-ion battery anodes, has a theoretical energy density of 372 milliamp hours per gram (mAh/g). In comparison, silicon has a high theoretical capacity of 4200 mAh/g. Silicon, however, swells in excess of 300% upon lithiation. Because of this expansion, anodes including silicon may expand/contract and lose electrical contact to the rest of the anode. Therefore, a silicon anode should be designed to be able to expand while maintaining good electrical contact with the rest of the electrode.

U.S. patent application Ser. No. 13/008,800, U.S. patent application Ser. No. 13/601,976, and U.S. patent application Ser. No. 13/799,405, each of which are incorporated by reference herein, describe certain embodiments of carbon-silicon composite materials using carbonized polymer and silicon material. The carbonized polymer can act as an expansion buffer for silicon particles during cycling so that a high cycle life can be achieved. In certain embodiments, the resulting electrode can be an electrode that is comprised substantially of active material. For example, the carbonized polymer can form a substantially continuous conductive carbon phase(s) in the entire electrode as opposed to particulate carbon suspended in a non-conductive binder in one class of conventional lithium-ion battery electrodes. Because the polymer can be converted into an electrically conductive and electrochemically active matrix, the resulting electrode can be conductive enough that a metal foil or mesh current collector may be omitted, minimized, or reduced in some embodiments. Accordingly, in U.S. patent application Ser. Nos. 13/008,800, 13/601,976, and 13/799, 405, certain embodiments of monolithic, self-supported electrodes are disclosed. The electrodes can have a high energy density of between about 500 mAh/g to about 3500 mAh/g that can be due to, for example, 1) the use of silicon, 2) elimination or substantial reduction of metal current collectors, and 3) being comprised entirely or substantially entirely of active material.

The carbon-silicon composite material can be formed by forming a mixture including a precursor, and pyrolyzing the precursor to convert the precursor to a carbon phase. In certain embodiments, the carbon precursor is a hydrocarbon compound. For example, the precursor can include polyamideimide, polyamic acid, polyimide, etc. Other precursors include phenolic resins, epoxy resins, and other polymers. The mixture can further include a solvent. For example, the solvent can be N-methyl-pyrollidone (NMP). Other possible solvents include acetone, diethyl ether, gamma butyrolactone, isopropanol, dimethyl carbonate, ethyl carbonate, dimethoxyethane, etc. Examples of precursor and solvent solutions include PI-2611 (HD Microsystems), PI-5878G (HD Microsystems) and VTEC PI-1388 (RBI, Inc.). PI-2611 is comprised of >60% n-methyl-2-pyrollidone and 10-30% s-biphenyldianhydride/p-phenylenediamine. PI-5878G is comprised of >60% n-methylpyrrolidone, 10-30% polyamic acid of pyromellitic dianhydride/oxydianiline, 10-30% aromatic hydrocarbon (petroleum distillate) including 5-10% 1,2,4-trimethylbenzene. In certain embodiments, the amount of precursor (e.g., solid polymer) in the solvent is about 10 wt. % to about 30 wt. %.

The mixture can include silicon particles as described herein. The mixture may comprise about 5% to about 80% by weight of the precursor, and at least about 20% to about 99% by weight of the silicon particles. Additional materials can also be included in the mixture. As an example, carbon particles including graphite active material, chopped or milled carbon fiber, carbon nanofibers, carbon nanotubes, and other conductive carbons can be added to the mixture. Conductive particles can also be added to the mixture. In addition, the mixture can be mixed to homogenize the mixture.

In certain embodiments, the mixture is cast on a substrate. In some embodiments, casting includes using a gap extrusion, tape casting, or a blade casting technique. The blade casting technique can include applying a coating to the substrate by using a flat surface (e.g., blade) which is controlled to be a certain distance above the substrate. A liquid or slurry can be applied to the substrate, and the blade can be passed over the liquid to spread the liquid over the substrate. The thickness of the coating can be controlled by the gap between the blade and the substrate since the liquid passes through the gap. As the liquid passes through the gap, excess liquid can also be scraped off. For example, the mixture can be cast on a substrate comprising a polymer sheet, a polymer roll, and/or foils or rolls made of glass or metal. The mixture can then be dried to remove the solvent. For example, a polyamic acid and NMP solution can be dried at about 110° C. for about 2 hours to remove the NMP solution. The dried mixture can then be removed from the substrate. For example, an aluminum substrate can be etched away with HCl. Alternatively, the dried mixture can be removed from the substrate by peeling or otherwise mechanically removing the dried mixture from the substrate.

In some embodiments, the substrate comprises polyethylene terephthalate (PET), including for example Mylar®. In certain embodiments, the dried mixture is a film or sheet. In some embodiments, the dried mixture is optionally cured. In some embodiments, the dried mixture may be further dried. For example, the dried mixture can be placed in a hot press (e.g., between graphite plates in an oven). A hot press can be used to further dry and/or cure and to keep the dried mixture flat. For example, the dried mixture from a polyamic acid and NMP solution can be hot pressed at about 200° C. for about 8 to 16 hours. Alternatively, the entire process including casting and drying can be done as a roll-to-roll process using standard film-handling equipment. The dried mixture can be rinsed to remove any solvents or etchants that may remain. For example, de-ionized (DI) water can be used to rinse the dried mixture. In certain embodiments, tape casting techniques can be used for the casting. In some embodiments, the mixture can be coated on a substrate by a slot die coating process (e.g., metering a constant or substantially constant weight and/or volume through a set or substantially set gap). In some other embodiments, there is no substrate for casting and the anode film does not need to be removed from any substrate. The dried mixture may be cut or mechanically sectioned into smaller pieces.

The mixture further goes through pyrolysis to convert the polymer precursor to carbon. In certain embodiments, the mixture is pyrolysed in a reducing atmosphere. For example, an inert atmosphere, a vacuum and/or flowing argon, nitrogen, or helium gas can be used. In some embodiments, the mixture is heated to about 900° C. to about 1350° C. For example, polyimide formed from polyamic acid can be carbonized at about 1175° C. for about one hour. In certain embodiments, the heat up rate and/or cool down rate of the mixture is about 10° C./min. A holder may be used to keep the mixture in a particular geometry. The holder can be graphite, metal, etc. In certain embodiments, the mixture is held flat. After the mixture is pyrolysed, tabs can be attached to the pyrolysed material to form electrical contacts. For example, nickel, copper or alloys thereof can be used for the tabs.

In certain embodiments, one or more of the methods described herein can be carried out in a continuous process. In certain embodiments, casting, drying, possibly curing and pyrolysis can be performed in a continuous process. For example, the mixture can be coated onto a glass or metal cylinder. The mixture can be dried while rotating on the cylinder to create a film. The film can be transferred as a roll or peeled and fed into another machine for further processing. Extrusion and other film manufacturing techniques known in industry could also be utilized prior to the pyrolysis step.

Pyrolysis of the precursor results in a carbon material (e.g., at least one carbon phase). In certain embodiments, the carbon material is a hard carbon. In some embodiments, the precursor is any material that can be pyrolysed to form a hard carbon. When the mixture includes one or more additional materials or phases in addition to the carbonized precursor, a composite material can be created. In particular, the mixture can include silicon particles, creating a silicon-carbon (e.g., at least one first phase comprising silicon and at least one second phase comprising carbon) or siliconcarbon-carbon (e.g., at least one first phase comprising silicon, at least one second phase comprising carbon, and at least one third phase comprising carbon) composite material.

Silicon particles can increase the specific lithium insertion capacity of the composite material. When silicon absorbs lithium ions, it experiences a large volume increase on the order of 300+ volume percent which can cause electrode structural integrity issues. In addition to volumetric expansion related problems, silicon is not inherently electrically conductive, but becomes conductive when it is alloyed with lithium (e.g., lithiation). When silicon de-lithiates, the surface of the silicon losses electrical conductivity. Furthermore, when silicon de-lithiates, the volume decreases which results in the possibility of the silicon particle losing contact with the matrix. The dramatic change in volume also results in mechanical failure of the silicon particle structure, in turn, causing it to pulverize. Pulverization and loss of electrical contact have made it a challenge to use silicon as an active material in lithium-ion batteries. A reduction in the initial size of the silicon particles can prevent further pulverization of the silicon powder as well as minimizing the loss of surface electrical conductivity. Furthermore, adding material to the composite that can elastically deform with the change in volume of the silicon particles can reduce the chance that electrical contact to the surface of the silicon is lost. For example, the composite material can include carbons such as graphite which contributes to the ability of the composite to absorb expansion and which is also capable of intercalating lithium ions adding to the storage capacity of the electrode (e.g., chemically active). Therefore, the composite material may include one or more types of carbon phases.

As described herein, in order to increase volumetric and gravimetric energy density of lithium-ion batteries, silicon may be used as the active material for the cathode or anode. Several types of silicon materials, e.g., silicon nanopowders, silicon nanofibers, porous silicon, and ball-milled silicon, are viable candidates as active materials for the negative or positive electrode. As described herein, the amount of silicon provided in the mixture or in the composite material can be within a range from about 20% to about 99% by weight (e.g., from about 30% to about 99% by weight, from about 40% to about 99% by weight, from about 50% to about 99% by weight, from about 60% to about 99% by weight, from about 70% to about 99% by weight, from about 80% to about 99% by weight, from about 90% to about 99% by weight, etc.) of the composite material.

In some embodiments, all, substantially all, or at least some of the silicon particles may have a particle size (e.g., the diameter or the largest dimension of the particle) less than about 50 µm, less than about 40 µm, less than about 30 µm, less than about 20 µm, less than about 10 µm, less than about 1 µm, between about 10 nm and about 50 µm, between about 10 nm and about 40 µm, between about 10 nm and about 30 µm, between about 10 nm and about 20 µm, between about 0.1 µm and about 20 µm, between about 0.5 µm and about 20 µm, between about 1 µm and about 20 µm, between about 1 µm and about 15 µm, between about 1 µm and about 10 µm, between about 10 nm and about 10 µm, between about 10 nm and about 1 µm, less than about 500 nm, less than about 100 nm, and about 100 nm. For example, in some embodiments, the average particle size (or the average diameter or the average largest dimension) or the median particle size (or the median diameter or the median largest dimension) of the silicon particles can be less than about 50 µm, less than about 40 µm, less than about 30 µm, less than about 20 µm, less than about 10 µm, less than about 1 µm, between about 10 nm and about 50 µm, between about 10 nm and about 40 µm, between about 10 nm and about 30 µm, between about 10 nm and about 20 µm, between about 0.1 µm and about 20 µm, between about 0.5 µm and about 20 µm, between about 1 µm and about 20 µm, between about 1 µm and about 15 µm, between about 1 µm and about 10 µm, between about 10 nm and about 10 µm, between about 10 nm and about 1 µm, less than about 500 nm, less than about 100 nm, and about 100 nm. In some embodiments, the silicon particles may have a distribution of particle sizes. For example, at least about 95%, at least about 90%, at least about 85%, at least about 80%, at least about 70%, or at least about 60% of the particles may have the particle size described herein.

In certain embodiments, the silicon particles are at least partially crystalline, substantially crystalline, and/or fully crystalline. Furthermore, the silicon particles may or may not be substantially pure silicon. For example, the silicon particles may be substantially silicon or may be a silicon alloy. In one embodiment, the silicon alloy includes silicon as the primary constituent along with one or more other elements.

Advantageously, the silicon particles described herein can improve performance of electro-chemically active materials such as improving capacity and/or cycling performance. Furthermore, electro-chemically active materials having such silicon particles may not significantly degrade as a result of lithiation of the silicon particles.

The amount of carbon obtained from the precursor can be greater than 0% to about 80% by weight such as about 1% to about 80% by weight, about 1% to about 70% by weight, about 1% to about 60% by weight, about 1% to about 50% by weight, about 1% to about 40% by weight, about 1% to about 30% by weight, about 5% to about 80% by weight, about 5% to about 70% by weight, about 5% to about 60% by weight, about 5% to about 50% by weight, about 5% to about 40% by weight, about 5% to about 30% by weight, about 10% to about 80% by weight, about 10% to about 70% by weight, about 10% to about 60% by weight, about 10% to about 50% by weight, about 10% to about 40% by weight, about 10% to about 30% by weight, about 10% to about 25% by weight, etc. For example, the amount of carbon obtained from the precursor can be about 1%, about 5%, about 10% by weight, about 15% by weight, about 20% by weight, about 25% by weight, etc. from the precursor.

The carbon from the precursor can be hard carbon. Hard carbon can be a carbon that does not convert into graphite even with heating in excess of 2800 degrees Celsius. Precursors that melt or flow during pyrolysis convert into soft carbons and/or graphite with sufficient temperature and/or pressure. Hard carbon may be selected since soft carbon precursors may flow and soft carbons and graphite are mechanically weaker than hard carbons. Other possible hard carbon precursors can include phenolic resins, epoxy resins, and other polymers that have a very high melting point or are crosslinked. The amount of hard carbon in the composite material can be any of the ranges described herein with respect to the amount of carbon obtained from the precursor. For example, in some embodiments, the amount of hard carbon in the composite material can have a value within a range of greater than 0% to about 80% such as about 1% to about 10%, about 1% to about 20%, about 1% to about 25%, about 1% to about 30%, about 1% to about 40%, about 1% to about 50%, about 5% to about 10%, about 5% to about 20%, about 5% to about 25%, about 5% to about 30%, about 5% to about 40%, about 5% to about 50%, about 10% to about 25% by weight, about 10% to about 30% by weight, about 10% to about 40% by weight, about 10% to about 50% by weight, etc. In some embodiments, the amount of hard carbon in the composite material can be about 1% by weight, about 5% by weight, about 10% by weight, about 20% by weight, about 30% by weight, about 40% by weight, about 50% by weight, or more than about 50% by weight. In certain embodiments, the hard carbon phase is substantially amorphous. In other embodiments, the hard carbon phase is substantially crystalline. In further embodiments, the hard carbon phase includes amorphous and crystalline carbon. The hard carbon phase can be a matrix phase in the composite material. The hard carbon can also be embedded in the pores of the additives including silicon. The hard carbon may react with some of the additives to create some materials at interfaces. For example, there may be a silicon carbide layer between silicon particles and the hard carbon.

In some embodiments, graphite is one of the types of carbon phases from the precursor. In certain embodiments, graphite particles are added to the mixture. Advantageously, graphite can be an electrochemically active material in the battery as well as an elastic deformable material that can respond to volume change of the silicon particles. Graphite is the preferred active anode material for certain classes of lithium-ion batteries currently on the market because it has a low irreversible capacity. Additionally, graphite is softer than hard carbon and can better absorb the volume expansion of silicon additives. In certain embodiments, all, substantially all, or at least some of the graphite particles may have a particle size (e.g., a diameter or a largest dimension) between about 0.5 microns and about 20 microns. In some embodiments, an average particle size (e.g., an average diameter or an average largest dimension) or median particle size (e.g., a median diameter or a median largest dimension) of the graphite particles is between about 0.5 microns and about 20 microns. In some embodiments, the graphite particles may have a distribution of particle sizes. For example, at least about 95%, at least about 90%, at least about 85%, at least about 80%, at least about 70%, or at least about 60% of the particles may have the particle size described herein. In certain embodiments, the composite material can include graphite particles in an amount greater than 0% and less than about 80% by weight, including from 40% to about 75% by weight, from about 5% to about 30% by weight, from 5% to about 25% by weight, from 5% to about 20% by weight, or from 5% to about 15% by weight.

In certain embodiments, conductive particles which may also be electrochemically active are added to the mixture. Such particles can enable both a more electronically conductive composite as well as a more mechanically deformable composite capable of absorbing the large volumetric change incurred during lithiation and de-lithiation. In certain embodiments, all, substantially all, or at least some of the conductive particles can have a particle size (e.g., the diameter or the largest dimension) between about 10 nanometers and about 7 micrometers. In some embodiments, an average particle size (e.g., an average diameter or an average largest dimension) or a median particle size (e.g., a median diameter or a median largest dimension) of the conductive particles is between about 10 nm and about 7 micrometers. In some embodiments, the conductive particles may have a distribution of particle sizes. For example, at least about 95%, at least about 90%, at least about 85%, at least about 80%, at least about 70%, or at least about 60% of the particles may have the particle size described herein.

In certain embodiments, the mixture includes conductive particles in an amount greater than zero and up to about 80% by weight. In some embodiments, the composite material includes about 45% to about 80% by weight. The conductive particles can be conductive carbon including carbon blacks, carbon fibers, carbon nanofibers, carbon nanotubes, etc. Many carbons that are considered as conductive additives that are not electrochemically active become active once pyrolysed in a polymer matrix. Alternatively, the conductive particles can be metals or alloys including copper, nickel, or stainless steel.

After the precursor is pyrolyzed, the resulting carbon material can be a self-supporting monolithic structure. The carbonized precursor results in an electrochemically active structure that holds the composite material together. For example, the carbonized precursor can be a substantially continuous phase. Advantageously, the carbonized precursor can be a structural material as well as an electro-chemically active and electrically conductive material. In certain embodiments, material particles added to the mixture are homogenously or substantially homogeneously distributed throughout the composite material to form a homogeneous or substantially homogeneous composite.

In some embodiments, the composite material and/or electrode does not include a polymer beyond trace amounts that remain after pyrolysis of the precursor. In further embodiments, the composite material and/or electrode does not include a non-electrically conductive binder. The composite material may also include porosity. In some embodiments, the composite material (or the film) can include porosity of about 1% to about 70% or about 5% to about 50% by volume porosity. For example, the porosity can be about 5% to about 40% by volume porosity.

A current collector may be preferred in some applications, for example, where current above a certain threshold or additional mechanical support may be desired. U.S. patent application Ser. No. 13/333,864, filed Dec. 21, 2011, and published on Jun. 19, 2014 as U.S. Patent Application Publication No. 2014/0170482, entitled "Electrodes, Electrochemical Cells, and Methods of Forming Electrodes and Electrochemical Cells," and U.S. patent application Ser. No. 13/796,922, filed Mar. 12, 2013, and published on Jun. 19, 2014 as U.S. Patent Application Publication No. 2014/0170475, entitled "Electrodes, Electrochemical Cells, and Methods of Forming Electrodes and Electrochemical Cells," each of which is incorporated by reference herein, describe certain embodiments of electrodes including a current collector, electrochemical cells comprising such electrodes, and methods of forming such electrodes and electrochemical cells.

In some embodiments, the full capacity of the composite material of the electrodes described herein may not be utilized during use of the battery to improve life of the battery (e.g., number charge and discharge cycles before the battery fails or the performance of the battery decreases below a usability level). For example, a composite material with about 70% by weight of silicon particles, about 20% by weight of carbon from a precursor, and about 10% by weight of graphite may have a maximum gravimetric capacity of about 3000 mAh/g, while the composite material may only be used up to an gravimetric capacity of about 550 to about 1500 mAh/g. Although, the maximum gravimetric capacity of the composite material may not be utilized, using the composite material at a lower capacity can still achieve a higher capacity than certain lithium ion batteries. In certain embodiments, the composite material is used or only used at an gravimetric capacity below about 70% of the composite material's maximum gravimetric capacity. For example, the composite material is not used at an gravimetric capacity above about 70% of the composite material's maximum gravimetric capacity. In further embodiments, the composite material is used or only used at an gravimetric capacity below about 50% of the composite material's maximum gravimetric capacity or below about 30% of the composite material's maximum gravimetric capacity.

Various embodiments have been described above. Although the invention has been described with reference to these specific embodiments, the descriptions are intended to be illustrative and are not intended to be limiting. Various modifications and applications may occur to those skilled in the art without departing from the true spirit and scope of the invention as defined in the appended claims.

What is claimed is:

1. A system comprising:
a battery comprising one or more cells, each cell having a silicon-containing electrode;
an expansion measurement device configured to measure an expansion of the battery; and
one or more processors configured to:
receive information relating to the expansion of the battery from the expansion measurement device;
determine one or both of a state of charge and a state of health of the battery based at least in part on the information, wherein the determining is based at least in part on change of the expansion as the battery is discharged and charged over multiple cycles;
control one or more functions of the battery based at least in part on the information; and
reset at least one of one or more expansion related baselines for a first state of charge, wherein the resetting is configured to account for effects of cycling the battery over time on the state of charge determination.

2. The system of claim 1, further comprising a display configured to provide the determined state of charge and/or state of health of the battery.

3. The system of claim 1, wherein the information relating to expansion of the battery comprises a thicknesses change, a volume change, and/or a pressure change of at least one cell of the battery.

4. The system of claim 3, wherein the one or more processors are configured to reset at least one of the one or more baselines at a known state of charge.

5. The system of claim 1, wherein the information comprises a change in fluid volume within the battery.

6. The system of claim 1, wherein the information comprises a change in pressure on fluid as measured by a force gauge within the battery.

7. The system of claim 1, wherein the battery is a lithium ion battery.

8. The system of claim 1, wherein the one or more cells comprise one or more silicon-dominant anodes.

9. The system of claim 1, wherein the one or more processors are configured to control charging/discharging of at least one of the one or more cells in the battery based at least in part on the expansion of the battery.

10. The system of claim 9, wherein the battery is configured to trigger one or more safety mechanisms when the expansion is above a threshold.

11. The system of claim 1, wherein the one or more processors are configured to control heating and/or cooling of the battery based at least in part on the expansion of the battery.

12. The system of claim 1, wherein the expansion measurement device is incorporated into the battery.

13. A method of managing a life cycle of a battery comprising one or more cells having a silicon-containing electrode, the method comprising:
measuring an expansion of the battery using an expansion measurement device in the battery;
obtaining by at least one processor associated with the battery, information relating to the expansion of the battery; and
controlling, using the at least one processor, one or more functions of the one or more cells of the battery based at least in part on the information, wherein the controlling comprises:
determining one or both of a state of charge and a state of health of the battery based at least in part on the information, and wherein the determining is based at least in part on change of the expansion as the battery is discharged and charged over multiple cycles; and
resetting at least one of one or more expansion related baselines for a first state of charge, and wherein the resetting is configured to account for effects of cycling the battery over time on the state of charge determination.

14. The method of claim 13, wherein the information relating to expansion of the battery comprises a thicknesses change, a volume change, and/or a pressure change of at least one cell of the battery.

15. The method of claim 13, comprising controlling the one or more functions based at least in part on the state of charge and/or state of health.

16. The method of claim 13, further comprising resetting at least one of the one or more baselines at a known state of charge.

17. The method of claim 13, further comprising determining gassing of one or more cells of the battery and/or damage to the battery based at least in part on the expansion.

18. The method of claim 13, further comprising triggering one or more safety mechanisms when the expansion is above a threshold.

19. The method of claim 13, wherein the information comprises a change in fluid volume within the battery.

20. The method of claim 13, wherein the information comprises a change in pressure on fluid within the battery.

21. The method of claim 13, wherein the battery is a lithium ion battery.

22. The method of claim 13, wherein the battery comprises one or more silicon-dominant anodes.

23. The method of claim 13, wherein the controlling comprises controlling heating and/or cooling of one or more cells of the battery based at least in part on the expansion of the battery.

24. The method of claim 13, wherein the controlling comprises controlling charging/discharging of one or more cells of the battery based at least in part on the expansion of the battery.

* * * * *